(12) United States Patent
Yu et al.

(10) Patent No.: US 6,979,835 B1
(45) Date of Patent: Dec. 27, 2005

(54) GALLIUM-NITRIDE BASED LIGHT-EMITTING DIODE EPITAXIAL STRUCTURE

(75) Inventors: Cheng-Tsang Yu, Wufong Township, Taichung County (TW); Ru-Chin Tu, Tainan (TW); Liang-Wen Wu, Banciao (TW); Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 10/940,806

(22) Filed: Sep. 11, 2004

(51) Int. Cl.[7] .................... H01L 29/06; H01L 33/00; H01L 31/0328
(52) U.S. Cl. .................... 257/22; 257/15; 257/103; 257/190
(58) Field of Search ................ 257/14–15, 21, 257/22, 79–86, 93–97, 103, 184, 190, 200–201

(56) References Cited

U.S. PATENT DOCUMENTS

| | | | |
|---|---|---|---|
| 6,312,967 B1 * | 11/2001 | Ikeda | 438/22 |
| 6,345,063 B1 * | 2/2002 | Bour et al. | 372/45.01 |
| 6,664,560 B2 * | 12/2003 | Emerson et al. | 257/14 |
| 6,734,033 B2 * | 5/2004 | Emerson et al. | 438/29 |
| 6,847,046 B1 * | 1/2005 | Wei et al. | 257/15 |
| 6,858,877 B2 * | 2/2005 | Kawaguchi et al. | 257/97 |
| 6,903,385 B2 * | 6/2005 | Gaska et al. | 257/192 |
| 6,911,676 B2 * | 6/2005 | Yoo | 257/93 |

* cited by examiner

Primary Examiner—Ori Nadav

(57) ABSTRACT

An epitaxial structure for the GaN-based LED is provided. The GaN-based LED uses a substrate usually made of sapphire or silicon-carbide (SiC). On top of the substrate, the GaN-based LED contains an n-type contact layer made of an n-type GaN-based material. On top of the n-type contact layer, the GaN-based LED further contains a lower barrier layer covering part of the surface of the n-type contact layer. A negative electrode is also on top of and has an ohmic contact with the n-type contact layer in an area not covered by the lower barrier layer. On top of the lower barrier layer, the GaN-based LED then further contains an active layer made of aluminum-gallium-indium-nitride, an upper barrier layer, a p-type contact layer made of a magnesium (Mg)-doped GaN material, and a positive electrode having an ohmic contact with the p-type contact layer, sequentially stacked in this order from bottom to top. Within this structure, each of the barrier layers further contains, from bottom to top, a first AlGaInN layer, a SiN layer, and a second AlGaInN layer.

10 Claims, 4 Drawing Sheets

GALLIUM-NITRIDE BASED LIGHT-EMITTING DIODE EPITAXIAL STRUCTURE

BACKGROUND OF THE INVENTION

1. Field of the Invention

The present invention relates to the gallium-nitride based light-emitting diode, and in particular to the epitaxial structure of the gallium-nitride based light-emitting diode.

2. The Prior Arts

Gallium-nitride (GaN) based light-emitting diodes (LEDs) has been the research and development focus in the academic arena and in the industries in recent years. A conventional practice for the GaN-based LEDs is to use the multi-quantum well (MQW) structure in the GaN-based LED's active layer, which is interposed between barrier layers made of Si-doped GaN. The barrier layers effectively confine the electrons and holes inside the active layer and, thereby, increase the possibility of forming the electron-hole pairs inside the active layer. This in turn increases the internal quantum efficiency and decreases the operating voltage as well of the GaN-based LED. However, the Si-doped barrier layers also have a side effect. The Si-doped barrier layers would absorb a number of the photons released by the joining of the electrons and holes in the active layer of the GaN-based LED. This would apparently decrease the external quantum efficiency of the GaN-based LED. In addition, the conventional Si-doped barrier layers have significantly different lattice constants from that of the MQW active layer. Due to the piezoelectric effect, excessive stress would therefore be developed among the epitaxial structure of the GaN-based LED, causing the GaN-based LED to have inferior device characteristics.

Accordingly, the present invention is directed to overcome the foregoing disadvantages of conventional GaN-based LEDs according to prior arts.

SUMMARY OF THE INVENTION

The present invention provides a number of epitaxial structures for the GaN-based LED so that the limitations and disadvantages from the prior arts can be obviated practically.

The main approach of the present invention is to use silicon-nitride ($Si_xN_y$, $x,y \geq 0$) and aluminum-gallium-indium-nitride ($Al_{1-w-z}Ga_wIn_zN$, $w,z \geq 0$, $1 \geq w+z \geq 0$) for forming the barrier layers above and beneath the MQW active layer, instead of using GaN as in prior arts. The MQW active layer and the barriers formed as such would have a rough interface so that the photons released from the active layer would have a better possibility to escape from the barrier layers. The GaN-based LED would therefore have better external quantum efficiency. In addition, within the barrier layers, the Si of the $Si_xN_y$ would diffuse into the $Al_{1-w-z}Ga_wIn_zN$, resulting in enhanced electrical characteristics and, thereby, lower operation voltage for the GaN-based LED. Moreover, the lattice constants of the barrier layers formed as such and the MQW active layers are more compatible so that the problem of excessive stress resulted from the piezoelectric effect is effectively solved.

The GaN-based LED according to the present invention has its epitaxial structure built upon a substrate usually made of sapphire or silicon-carbide (SiC). The GaN-based LED then contains an n-type contact layer made of an n-type GaN-based material on top of a side of the substrate. On top of the n-type contact layer, the GaN-based LED further contains a lower barrier layer covering part of the surface of the n-type contact layer. A negative electrode is also on top of and has an ohmic contact with the n-type contact layer in an area not covered by the lower barrier layer. On top of the lower barrier layer, the GaN-based LED further contains an active layer made of aluminum-gallium-indium-nitride, an upper barrier layer, a p-type contact layer made of a magnesium (Mg)-doped GaN material, and a positive electrode having an ohmic contact with the p-type contact layer, sequentially stacked in this order from bottom to top.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

In the following, detailed description along with the accompanied drawings is given to better explain preferred embodiments of the present invention. Please be noted that, in the accompanied drawings, some parts are not drawn to scale or are somewhat exaggerated, so that people skilled in the art can better understand the principles of the present invention.

Figure 1:
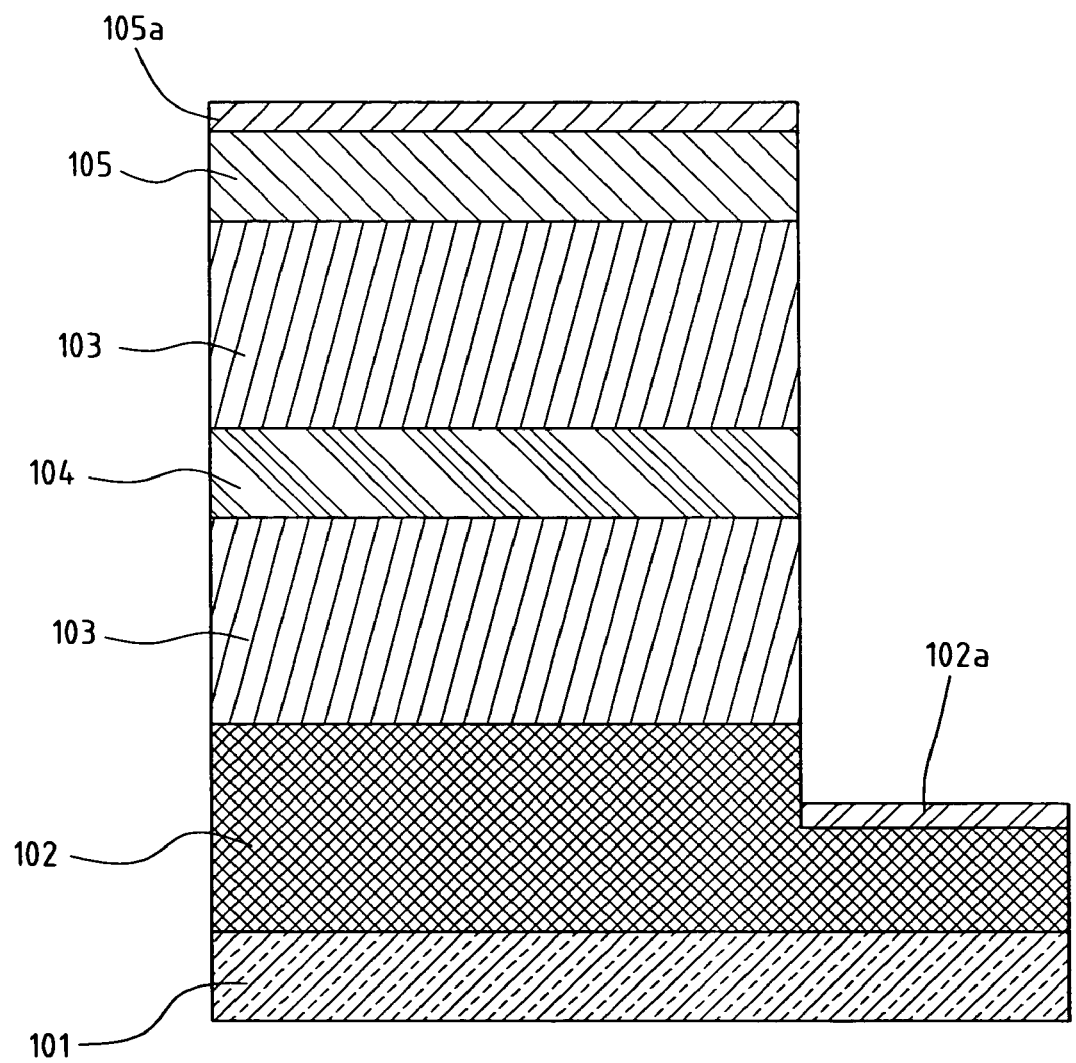
FIG. 1 is a schematic diagram showing the epitaxial structure of the GaN-based LED according to the first embodiment of present invention.

FIG. 1 is a schematic diagram showing the epitaxial structure of the GaN-based LED according to the first embodiment of present invention. On the other hand, the inner structure of the barrier layer within the epitaxial structure is depicted in FIG. 2.

As shown in FIG. 1, the GaN-based LED is formed by stacking a n-type contact layer 102, a lower barrier layer 103, an active layer 104, an upper barrier layer 103, a p-type contact layer 105, sequentially in this order from bottom to top on an upper side of a substrate 101.

The substrate 101 is made of C-plane, R-plane, or A-plane aluminum-oxide monocrystalline (or sapphire), or an oxide monocrystalline having a lattice constant compatible with that of nitrides. The substrate 101 can also be made of SiC (6H—SiC or 4H—SiC), Si, ZnO, GaAs, or $MgAl_2O_4$. Generally, the most common material used for the substrate 101 is sapphire or SiC. On an upper side of the substrate 101, an n-type contact layer 102 is formed and made of an n-type GaN material. On top of a part of the n-type contact layer 102's upper surface, there is a negative electrode 102a having an ohmic contact with the n-type contact layer 102. On top of another part of the n-type contact layer 102's upper surface, there is a barrier layer 103.

Figure 2:
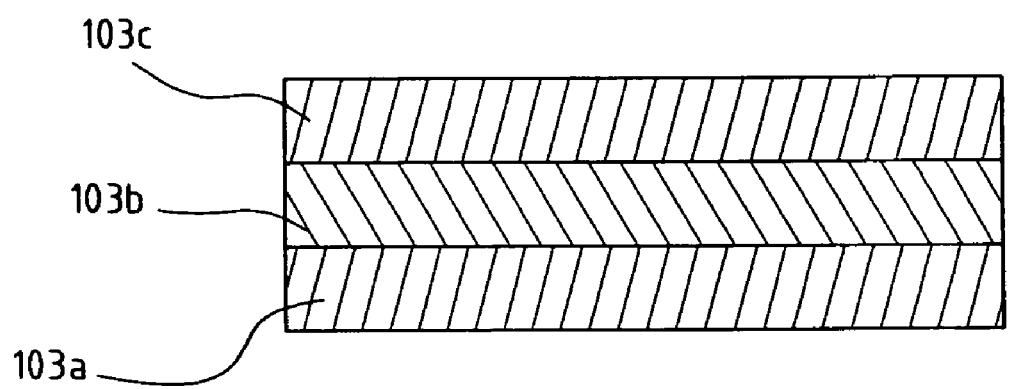
FIG. 2 is a schematic diagram showing an inner structure of the barrier layer within the epitaxial structure depicted in FIG. 1.

As shown in FIG. 2, the barrier layer 103 further contains a first AlGaInN layer 103a, a SiN layer 103b, and a second AlGaInN layer 103c, sequentially stacked from bottom to top in this order. The first AlGaInN layer 103a is made of $Al_{1-a-b}Ga_aIn_bN$ (a,b≧0, 1≧a+b≧0) having a specific composition and a wider band gap than that of the active layer 104. The first AlGaInN layer 103a is formed under a growing temperature between 400° C. and 1000° C., and has a thickness between 5 Å and 300 Å. The SiN layer 103b is made of $Si_cN_d$ (c,d≧0) having a specific composition. The SiN layer 103b is formed under a growing temperature between 400° C. and 1000° C., and has a thickness between 5 Å and 300 Å. On the other hand, the second AlGaInN layer 103c is made of $Al_{1-e-f}Ga_eIn_fN$ (e,f≧0, 1≧e+f≧0) having another specific composition and a wider band gap than that of the active layer 104. The second AlGaInN layer 103c is formed under a growing temperature between 400° C. and 1000° C., and has a thickness between 5 Å and 300 Å.

The active layer 104 is made of $Al_{1-g-h}Ga_gIn_hN$ (g,h≧0, 1≧g+h≧0) having a specific composition. The active layer 104 is formed under a growing temperature between 400° C. and 1000° C., and has a thickness between 5 Å and 100 Å. On top of active layer 104, the upper barrier layer 103 has the same inner structure as depicted in FIG. 2, and is made of the same type of materials but with its own specific composition formed under the same process as described earlier.

The p-type contact layer 105 is made of an Mg-doped GaN material. On top of the p-type contact layer 105, there is a positive electrode 105a having an ohmic contact with the p-type contact layer 105.

Figure 3:
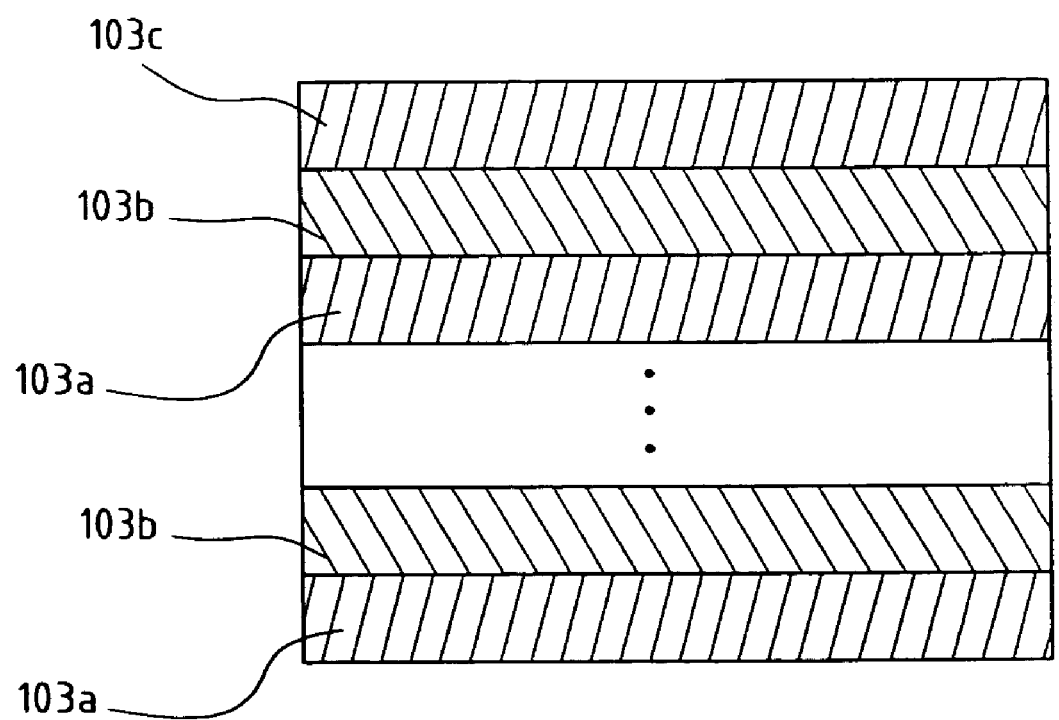
FIG. 3 is a schematic diagram showing another inner structure of the barrier layer within the epitaxial structure depicted in FIG. 1.

FIG. 3 is a schematic diagram showing another inner structure of the barrier layer within the epitaxial structure depicted in FIG. 1.

As shown in FIG. 3, the barrier layer 103 further contains multiple first AlGaInN layers 103a and multiple SiN layers 103b, alternately stacked upon each other from bottom to top with a first AlGaInN layer 103a at the bottom and a SiN layer 103b at the top. The number of the AlGaInN layers 103a is the same as that of the SiN layers 103b. On top of the topmost SiN layer 103b, there is a second AlGaInN layer 103c. Each of the first AlGaInN layer 103a is made of $Al_{1-i-j}Ga_iIn_jN$ (i,j≧0, 1≧i+j≧0) having a specific composition and a wider band gap than that of the active layer 104. The first AlGaInN layers 103a are all formed under a growing temperature between 400° C. and 1000° C., and all have a thickness between 5 Å and 300 Å. Each of the SiN layers 103b is made of $Si_mN_n$ (m,n≧0) having a specific composition. The SiN layers 103b are all formed under a growing temperature between 400° C. and 1000° C., and all have a thickness between 5 Å and 300 Å. On the other hand, the second AlGaInN layer 103c is made of $Al_{1-p-q}Ga_pN$ (p,q≧0, 1≧p+q≧0) having another specific composition and a wider band gap than that of the active layer 104.

Within the epitaxial structure of the GaN-based LED as depicted in FIG. 1, the upper barrier layer 103, or the lower barrier layer 103, or both can have the inner structure as depicted in FIG. 3.

Figure 4:
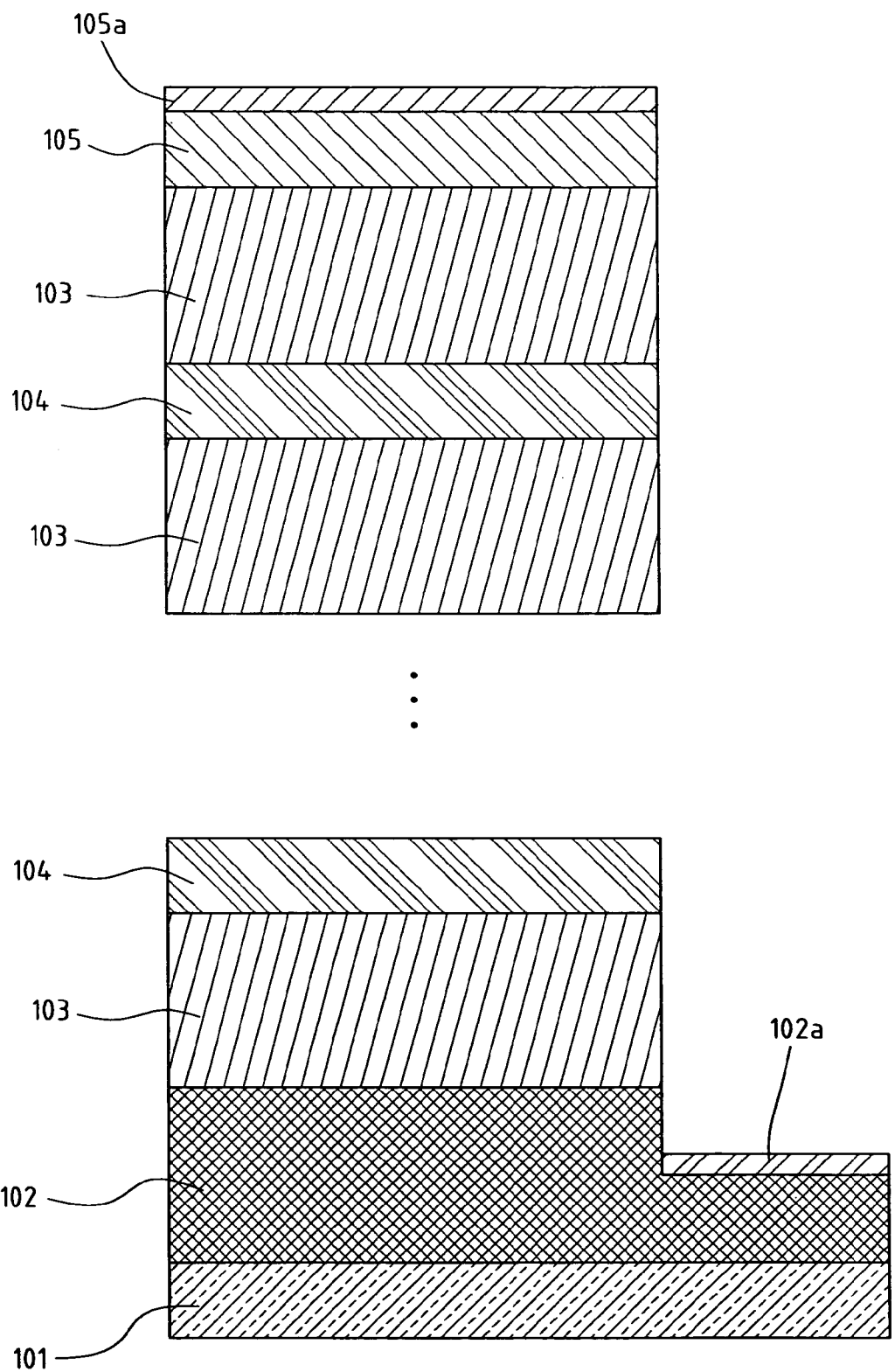
FIG. 4 is a schematic diagram showing the epitaxial structure of the GaN-based LED according to the second embodiment of present invention.

FIG. 4 is a schematic diagram showing the epitaxial structure of the GaN-based LED according to the second embodiment of present invention.

As shown in FIG. 4, the GaN-based LED contains a substrate 101, a n-type contact layer 102, multiple barrier layers 103 and multiple active layers 104 alternately stacked upon each other from bottom to top with a barrier layer 103 at the bottom and an active layer 104 at the top, another barrier layer 103 on top of the topmost active layer 104, and a p-type contact layer 105, sequentially stacked in this order.

The substrate 101, the n-type contact layer 102, the barrier layer 103, the active layer 104, and the p-type contact layer 105 are all formed in processes identical to those of the first embodiment.

Please be noted that each of the AlGaInN layers 103a and 103c within the barrier layers 103 has a wider band gap than that of the active layer 104.

Each of the barrier layers 103 within the second embodiment of the present invention as depicted in FIG. 4 can have the simple inner structure as depicted in FIG. 2, or the interleaving structure as depicted in FIG. 3.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A GaN-based LED structure, comprising:
   a substrate made of a material selected from the group consisting of sapphire, 6H—SiC, 4H—SiC, Si, ZnO, GaAs, $MgAl_2O_4$, and an oxide monocrystalline having a lattice constant compatible with that of nitrides;
   an n-type contact layer made of an n-type GaN material on top of an upper side of said substrate;
   a lower barrier layer on top of a part of said n-type contact layer's upper surface;
   an active layer on top said first barrier layer;
   an upper barrier layer on top of said active layer;
   a p-type contact layer made of an Mg-doped GaN material on top of said upper barrier layer;
   a positive electrode having an ohmic contact with and located on top of said p-type contact layer; and
   a negative electrode having an ohmic contact with and located on top of another part of said n-type contact layer's upper surface not covered by said fist barrier layer, wherein each of said lower and upper barrier layers further comprises a first AlGaInN layer having a wider band gap than that of said active layer, a SiN layer, and a second AlGaInN layer having a wider band gap than that of said active layer, sequentially stacked from bottom to top in this order.

2. The GaN-based LED structure according to claim 1, wherein at least one of said barrier layers further contains, on top of said SiN layer and below said second AlGaInN layer, at least one pair of a first AlGaInN layer and a SiN layer on top of said first AlGaInN layer, sequentially and repetitively stacked in this order from bottom to top.

3. The GaN-based LED structure according to claim 1, wherein each of said AlGaInN layers is made of $Al_{1-a-b}Ga_aIn_bN$ (a,b≧0, 1≧a+b≧0) having a specific composition formed under a growing temperature between 400° C. and 1000° C. to a thickness between 5 Å and 300 Å.

4. The GaN-based LED structure according to claim 1, wherein said SiN layer is made of $Si_cN_d$ (c,d≧0) having a specific composition formed under a growing temperature between 400° C. and 1000° C. to a thickness between 5 Å and 300 Å.

5. The GaN-based LED structure according to claim 1, wherein said active layer is made of $Al_{1-g-h}Ga_gIn_hN$ (g,h≧0, 1≧g+h≧0) having a specific composition formed under a growing temperature between 400° C. and 1000° C. to a thickness between 5 Å and 100 Å.

6. A GaN-based LED structure, comprising:
a substrate made of a material selected from the group consisting of sapphire, 6H—SiC, 4H—SiC, Si, ZnO, GaAs, MgAl$_2$O$_4$, and an oxide monocrystalline having a lattice constant compatible with that of nitrides;
an n-type contact layer made of an n-type GaN material on top of an upper side of said substrate;
a plurality of barrier layers and a plurality active layers alternately stacked upon each other from bottom to top with a bottommost barrier layer on top of a part of said n-type contact layer's upper surface and an active layer at the top;
another barrier layer on top of said topmost active layer;
a p-type contact layer made of an Mg-doped GaN material on top of said another barrier layer;
a positive electrode having an ohmic contact with and located on top of said p-type contact layer; and
a negative electrode having an ohmic contact with and located on top of another part of said n-type contact layer's upper surface not covered by said bottommost barrier layer,
wherein each of said barrier layers further comprises a first AlGaInN layer having a wider band gap than that of said active layer, a SiN layer, and a second AlGaInN layer having a wider band gap than that of said active layer, sequentially stacked from bottom to top in this order.

7. The GaN-based LED structure according to claim 6, wherein at least one of said barrier layers further contains, on top of said SiN layer and below said second AlGaInN layer, at least one pair of a first AlGaInN layer and a SiN layer on top of said first AlGaInN layer, sequentially and repetitively stacked in this order from bottom to top.

8. The GaN-based LED structure according to claim 6, wherein each of said AlGaInN layers is made of Al$_{1-r-s}$Ga$_r$In$_s$N ($r,s \geqq 0$, $1 \geqq r+s \geqq 0$) having a specific composition formed under a growing temperature between 400° C. and 1000° C. to a thickness between 5 Å and 300 Å.

9. The GaN-based LED structure according to claim 6, wherein said SiN layer is made of Si$_u$N$_v$ ($u,v \geqq 0$) having a specific composition formed under a growing temperature between 400° C. and 1000° C. to a thickness between 5 Å and 300 Å.

10. The GaN-based LED structure according to claim 6, wherein said active layer is made of Al$_{1-o-t}$Ga$_o$In$_t$N ($o,t \geqq 0$, $1 \geqq o+t \geqq 0$) having a specific composition formed under a growing temperature between 400° C. and 1000° C. to a thickness between 5 Å and 10 Å.

* * * * *